United States Patent
Shiv et al.

(10) Patent No.: US 6,661,153 B1
(45) Date of Patent: Dec. 9, 2003

(54) METHOD AND APPARATUS FOR DRIVING PIEZOELECTRIC MOTORS

(75) Inventors: Lior Shiv, Yokneam-Ilit (IL); Izhak Rafaeli, Haifa (IL); Nir Karasikov, Haifa (IL)

(73) Assignee: Nanomotion Ltd., Yokneam (IL)

( * ) Notice: Subject to any disclaimer, the term of this patent is extended or adjusted under 35 U.S.C. 154(b) by 0 days.

(21) Appl. No.: 09/830,375

(22) PCT Filed: Sep. 30, 1999

(86) PCT No.: PCT/IL99/00520

§ 371 (c)(1),
(2), (4) Date: Apr. 24, 2001

(87) PCT Pub. No.: WO00/25369

PCT Pub. Date: May 4, 2000

(30) Foreign Application Priority Data

Oct. 25, 1998 (IL) .................................................. 00519

(51) Int. Cl.$^7$ .............................................. H01L 41/04
(52) U.S. Cl. .................. 310/316.01; 361/272
(58) Field of Search ............ 310/316.01; 361/272, 361/278

(56) References Cited

U.S. PATENT DOCUMENTS

| | | | |
|---|---|---|---|
| 5,021,725 A | * 6/1991 | Jimbo et al. | 318/801 |
| 5,130,619 A | 7/1992 | Izuno | 318/116 |
| 5,214,339 A | 5/1993 | Naito | 310/316 |
| 5,438,229 A | 8/1995 | Ohtsuchi et al. | 310/316 |
| 5,453,653 A | 9/1995 | Zumeris et al. | 310/323 |
| 5,461,273 A | 10/1995 | Kawasaki et al. | 310/316 |
| 5,475,288 A | 12/1995 | Furukoshi | 318/116 |
| 5,500,565 A | 3/1996 | Okubo | 310/316 |
| 5,563,464 A | 10/1996 | Okubu | 310/316 |
| 5,563,478 A | 10/1996 | Suganuma | 318/116 |
| 5,625,246 A | 4/1997 | Suganuma | 310/316 |
| 5,644,199 A | 7/1997 | Nojima et al. | 318/314 |
| 5,714,833 A | 2/1998 | Zumeris | 310/328 |
| 5,777,423 A | 7/1998 | Zumeris | 310/323 |
| 5,834,864 A | * 11/1998 | Hesterman et al. | 310/40 MM |
| 5,998,899 A | * 12/1999 | Rosen et al. | 310/90.5 |

FOREIGN PATENT DOCUMENTS

EP   0712176   5/1996

OTHER PUBLICATIONS

Ikeda, T.; "Fundamentals of Piezoelectricity;" Oxford University Press; 1990; pp. 94–97.

Edry, D. et al.; "Capacitive–Loaded Push–Pull Parallel–Resonant Converter;" IEEE Transactions on Aerospace and Electronic Systems; vol. 29; No. 4; Oct. 1993; pp. 1287–1296.

Gulko, M. et al.; "Current–Sourcing Push–Pull Parallel–Resonance Inverter (CS–PPRI): Theory and Application as a Discharge Lamp Driver;" IEEE Transactions on Industrial Electronics, vol. 41; No. 3; Jun. 1994; pp. 285–291.

(List continued on next page.)

Primary Examiner—Michael C. Zarroli
(74) Attorney, Agent, or Firm—Fenster & Company (57) ABSTRACT

A method is provided for exciting vibrations in a piezoelectric motor having a plurality of electrode sets, each set comprising at least one first electrode and at least one second electrode between which AC voltages are applied to excite vibrations in the piezoelectric motor, the method comprising: coupling an AC power source to the at least one first electrode and at least one second electrode of a first electrode set; electrically connecting the at least one first electrode to the at least one second electrode of a second set of electrodes with a non-zero impedance that is substantially less than an impedance between them resulting from stray capacitive coupling; and energizing the power source to apply an AC voltage difference between the at least one first electrode and at least one second electrode of the first set of electrodes to excite the vibrations.

17 Claims, 8 Drawing Sheets

OTHER PUBLICATIONS

Ivensky, G. et al.; "Current–Fed Multiresonant Isolated DC–DC Converter;" IEEE Transactions on Aerospace and Electronic Systems; vol. 33; No. 1; Jan. 1997; pp. 53–63.

Ivensky, G. et al.; "Current–Fed Multi–Resonant DC–DC Converter;" IEEE Applied Power Electronics Conference (APEC '93) Record; Mar. 1993; pp. 58–64.

Gulko, M. et al.; "Current–Sourcing Push–Pull Parallel–Resonance Inverter (CS–PPRI): Theory and Application as a Fluorescent Lamp Driver;" IEEE Applied Power Electronics Conference (APEC '93) Record; Mar. 1993; pp. 411–417.

Gulko, M. et al.; "Inductor–Controlled Current–Sourcing Resonant Inverter and its Application as a High Pressure Discharge Lamp Driver;" IEEE Applied Power Electronics Conference APEC–94; 1994; pp. 434–440.

Edry, D. et al.; "Dynamics of the Capacitive–Loaded Push–Pull Parallel–Resonant Converter: Investigation by a SPICE Compatible Average Model;" IEEE Applied Power Electronics Conference APEC–94; 1994; pp. 1035–1041.

Ben–Yaakov, S. et al.; "The Simplest Electronic Ballast for HID Lamps;" IEEE Applied Power Electronics Conference APEC–96; pp. 634–640.

Gulko, M. et al.; "A MHz Electronic Ballast for Automotive–Type HID Lamps"; PESC–97; 1997; pp. 39–45.

Collins, R. A.; "The Giant Handbook of Electronic Circuits;" Tab Books Inc.; 1980; pp. 174–177.

* cited by examiner

METHOD AND APPARATUS FOR DRIVING PIEZOELECTRIC MOTORS

RELATED APPLICATIONS

The present application is a U.S. national application of PCT/IL99/00520, filed Sep. 30, 1999.

FIELD OF THE INVENTION

The invention relates to piezoelectric motors and in particular to methods for powering piezoelectric motors using resonant circuits.

BACKGROUND OF THE INVENTION

Generally, a piezoelectric micromotor is driven with a high voltage AC driving circuit that applies an alternating polarity voltage difference between at least one first electrode and at least one second electrode comprised in the piezoelectric micromotor. The frequency of the AC voltage difference applied to the electrodes is close to a desired frequency of vibration of the piezoelectric motor. To assure proper operation of the motor, the power supply is electrically matched to electrical characteristics of the motor so that power is efficiently transmitted to the motor at the desired frequency of vibration. The at least one first electrode, hereinafter referred to as a first "driving electrode", and at least one second electrode, hereinafter referred to as a second "driving electrode", define a "driving set" of electrodes of the piezoelectric motor.

Often a piezoelectric motor comprises more than one driving set of first and second driving electrodes. Different driving sets of first and second driving electrodes are electrified to excite different desired vibration modes in the piezoelectric motor. Electrodes that are electrified by direct connection to a driving circuit while exciting a desired vibration mode are said to be active electrodes and a driving set to which the electrodes belong is said to be an active driving set. Electrodes that are not electrified by direct connection to the driving circuit while exciting a particular vibration mode and the driving sets to which they belong are said to be passive. Passive electrodes are either floating or grounded.

Transmission of power to a desired vibration mode of the piezoelectric motor is generally sensitive to changes in stray capacitance between passive electrodes and ground and changes in capacitance between conducting wires, hereinafter referred to as "driving lines" that connect the driving circuit to the piezoelectric motor. Hereinafter, stray capacitance to ground and capacitance between driving lines are referred to generically as stray capacitance. Changes in stray capacitance generate mismatches between desired resonant vibration frequencies of the motor and frequencies at which power is efficiently transmitted from the driving circuit to the motor. These mismatches can substantially degrade the performance of the piezoelectric motor.

In particular changes in stray capacitance are caused by changes in the lengths the driving lines used to connect the driving circuit to the motor. For example, assume that the driving circuit is matched to a resonant frequency of the piezoelectric motor and that the driving circuit is connected to the piezoelectric motor by driving lines two meters long. If it is required to increase the length of the driving lines to six meters, the increased capacitance between the driving lines changes the resonant frequency of the load that the driving circuit drives and generates a mismatch between the driving circuit and the piezoelectric motor.

SUMMARY OF THE INVENTION

An aspect of some preferred embodiments of the present invention relates to providing a piezoelectric motor whose operation is less susceptible than is the operation of prior art piezoelectric motors to the effects of changes in stray capacitance, and in particular to changes in stray capacitance caused by changes in lengths of driving lines that connect the piezoelectric motor to a driving circuit.

In preferred embodiments of the present invention, first and second driving electrodes of a passive driving set of electrodes in the piezoelectric motor are connected in parallel with an impedance substantially smaller than impedance between them resulting from stray capacitive coupling. As a result, mismatches between a frequency at which the driving circuit supplies power to the piezoelectric motor and a desired resonant vibration frequency of the motor caused by changes in stray capacitance, are substantialy moderated.

In some preferred embodiments of the present invention the first and second driving electrodes of the passive driving set are connected by a capacitor. The capacitance of the capacitor is preferably substantially larger than the capacitance generated by any stray capacitive coupling of the first and second electrodes. The connected capacitor, hereinafter referred to as a "moderating capacitor", is preferably permanently connected between the first and second driving electrodes and is connected between them when they are active and when they are passive. The capacitance of a moderating capacitor while preferably substantially larger than the capacitance of any stray capacitive coupling of its driving set of electrodes, is preferably chosen small enough so that sufficient power reaches the piezoelectric motor when the driving set is electrified by an appropriate AC power supply to excite vibrations in the piezoelectric motor.

In some preferred embodiments of the present invention the impedance between the first and second driving electrodes is reduced to substantially zero by short-circuiting the electrodes for a non-active driving set. The short-circuit is removed when the electrodes are active and used to excite a desired vibration in the motor.

There is therefore provided in accordance with a preferred embodiment of the present invention a method for exciting vibrations in a piezoelectric motor having a plurality of electrode sets, each set comprising at least one first electrode and at least one second electrode between which AC voltages are applied to excite vibrations in the piezoelectric motor, the method comprising; coupling an AC driving circuit to the at least one first electrode and at least one second electrode of a first electrode set; electrically connecting the at least one first electrode to the at least one second electrode of a second set of electrodes with a non-zero impedance that is substantially less than an impedance between them resulting from stray capacitive coupling; and energizing the driving circuit to apply an AC voltage difference between the at least one first electrode and at least one second electrode of the first set of electrodes to excite the vibrations.

Preferably eclectically connecting the at least one first electrode to the at least one second electrode of the second set of electrodes comprises connecting them with a first capacitor having a capacitance substantially larger than a capacitance between them resulting from stray capacitive coupling.

Preferably connecting a first capacitor comprises closing a switch, which switch is operable to be open or closed to respectively disconnect the first capacitor from the electrodes and connect the first capacitor to the electrodes.

Coupling an AC driving circuit to the at least one first electrode and at least one second electrode of the first electrode set preferably comprises opening a switch, which switch is operable to be open or closed to respectively disconnect a second capacitor from between the electrodes and connect the second capacitor between the electrodes.

In some preferred embodiments of the present invention the method comprises connecting the at least one first electrode to the at least one second electrode of the first electrode set with a second capacitor having a capacitance substantially larger than a capacitance between them resulting from stray capacitive coupling.

Preferably, the first and second capacitors are connected permanently between their respective at least one first and at least one second electrodes.

Additionally or alternatively, the first and second capacitors preferably have substantially the same capacitance.

There is further provided in accordance with a preferred embodiment of the present invention, a method for exciting vibrations in a piezoelectric motor having a plurality of electrode sets, each set comprising at least one first electrode and at least one second electrode between which AC voltages are applied to excite vibrations in the piezoelectric motor, the method comprising; coupling a resonant AC driving circuit to the at least one first electrode and at least one second electrode of a first electrode set; short-circuiting the at least one first electrode to the at least one second electrode of a second electrode set; and energizing the resonant AC driving circuit to apply an AC voltage difference between the at least one first electrode and at least one second electrode of the first set of electrodes to excite the vibrations.

Preferably, short-circuiting the electrodes comprises closing a switch operable to be open and closed to respectively disconnect from between the electrodes and connect between the electrodes a substantially zero impedance.

Preferably, coupling a resonant AC driving circuit to the at least one first electrode and at least one second electrode of the first electrode set comprises opening a switch, which switch is operable to be open and closed to respectively disconnect from between the electrodes and connect between them a substantially zero impedance.

There is further provided in accordance with a preferred embodiment of the present invention, a piezoelectric motor comprising: a plurality of sets of electrodes, each set comprising at least one first electrode and at least one second electrode between which AC voltages are applied to excite vibration modes in the piezoelectric motor; and a capacitor for each set of electrodes that connects the at least one first electrode to the at least one second electrode of the set of electrodes wherein the capacitor has a capacitance substantially larger than a stray capacitance between the at least one first and at least one second electrode.

Preferably the capacitor for each set of electrodes has a capacitance substantially greater than the capacitance between the at least one first electrode and the at least one second electrode of the set of electrodes.

Additionally or alternatively, the capacitor for each set of electrodes is preferably permanently connected between the at least one first electrode and at least one second electrode of the set of electrodes.

In some preferred embodiments of the present invention, the piezoelectric motor comprises a switch for each set of electrodes operable to be open and closed to respectively disconnect the capacitor from between the electrodes and connect the capacitor between the electrodes.

Additionally or alternatively all the capacitors preferably have substantially a same capacitance.

There is further provided in accordance with a preferred embodiment of the present invention, a piezoelectric motor comprising: a plurality of sets of electrodes, each set comprising at least one first electrode and at least one second electrode between which AC voltages are applied to excite vibration modes in the piezoelectric motor; and a switch between the first and second at least one electrode, which switch is operable to be open and closed to respectively disconnect from between the electrodes and connect between the electrodes a substantially zero impedance.

BRIEF DESCRIPTION OF FIGURES

The invention will be more clearly understood by reference to the following description of preferred embodiments thereof read in conjunction with the figures attached hereto. In the figures, identical structures, elements or parts which appear in more than one figure are generally labeled with the same numeral in all the figures in which they appear. Dimensions of components and features shown in the figures are chosen for convenience and clarity of presentation and are not necessarily shown to scale. The figures are listed below.

DETAILED DESCRIPTION OF PREFERRED EMBODIMENTS

Figure 1A:
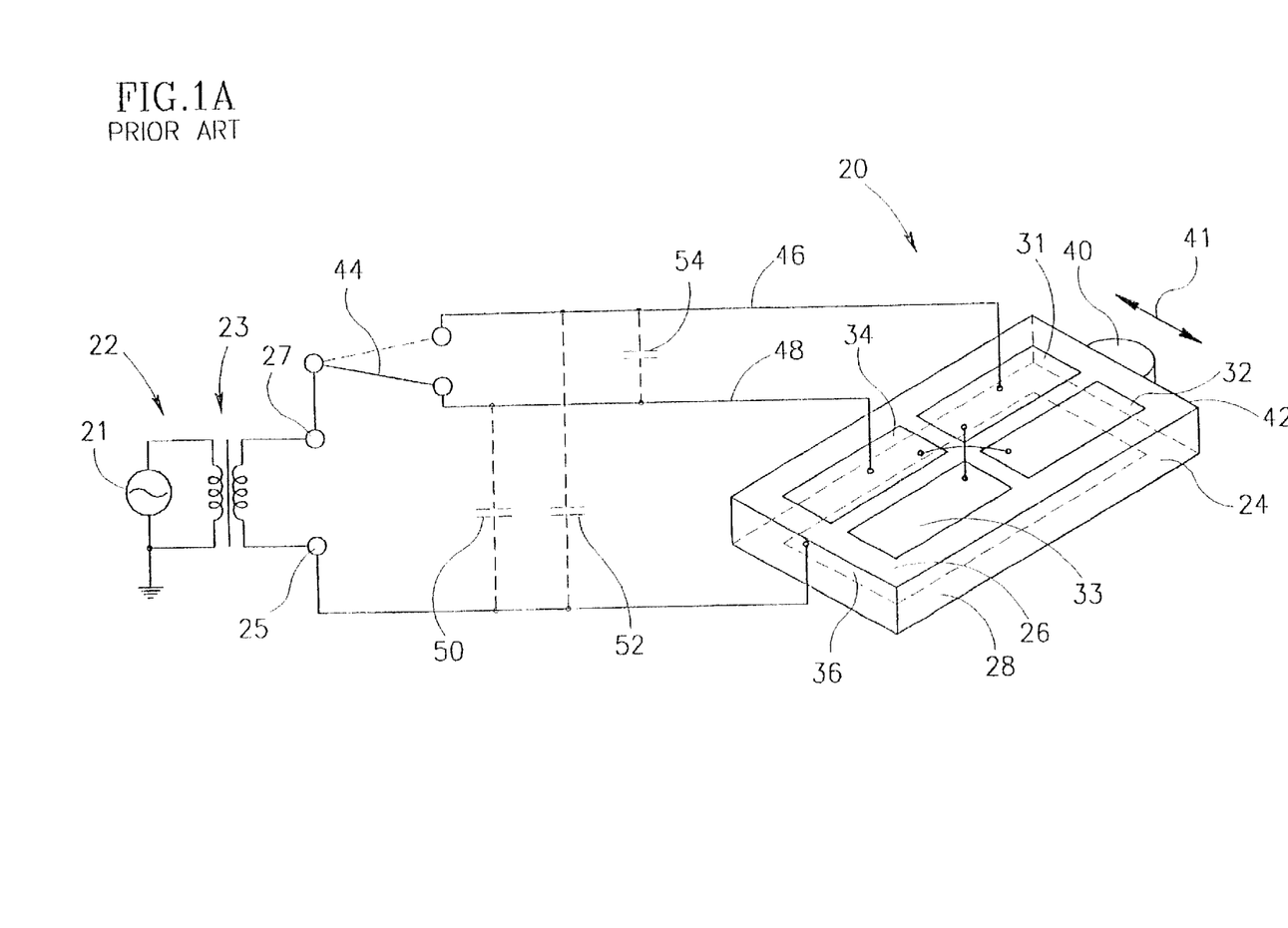
FIG. 1A schematically shows a piezoelectric motor being driven by an AC driving circuit in accordance with prior art.

FIG. 1A schematically shows a piezoelectric motor 20 being powered by an AC driving circuit 22, in accordance with the prior art.

Piezoelectric motor 20 is of a type described in U.S. Pat. No. 5,453,653, to Zumeris et al, the disclosure which is incorporated herein by reference. Piezoelectric motor 20 comprises a thin rectangular ceramic piezoelectric crystal 24 having a lop planar surface 26 and a bottom planar surface 28. Bottom planar surface 28 is normally hidden in the perspective of FIG. 1A and is shown in ghost lines. Four quadrant electrodes 31, 32, 33 and 34 are located in a symmetric checkerboard pattern on top face surface 26. A single large electrode 36, shown in ghost lines, is located on bottom surface 28. Preferably, a friction nub 40 on an edge surface 42 is used for coupling vibrations of piezoelectric motor 20 to a moveable element.

Vibrations in piezoelectric motor 20 are used to generate clockwise and counter clockwise elliptical vibrations in friction nub 40. These clockwise and counterclockwise elliptical vibrations of friction nub 40 are useable to move a moveable element (not shown), to which friction nub 40 is pressed, in either direction along double arrowhead !in-e 41.

Diagonally opposite quadrant electrodes 31 and 33 are electrically connected together to form an electrode referred to hereinafter as "diagonal driving electrode 31-33". Similarly, diagonally opposite electrodes 32 and 34 are connected together to form a diagonal driving electrode 32-34. When an AC voltage is applied between diagonal driving electrode 31-33 and large electrode 36, piezoelectric friction nub 40 vibrates clockwise. When an AC voltage difference is applied between diagonal driving electrode 32-34 and large electrode 36, friction nub 40 vibrates counterclockwise.

Diagonal driving electrode 31-33 and large electrode 36 are first and second driving electrodes respectively of one driving set of electrodes of piezoelectric motor 20. Diagonal driving electrode 32-34 and large electrode 36 are a second driving set of first and second driving electrodes respectively of piezoelectric motor 20. Large electrode 36 functions as a second driving electrode for both first and second driving sets of electrodes. When diagonal driving electrode 31-33 is active and electrified with respect to large electrode 36, diagonal driving electrode 32-34 (and the driving set comprising diagonal driving electrode 32-34 and large electrode 36) is passive and either floating or grounded. When diagonal driving electrode 32-34 is active, diagonal driving electrode 31-33 (and the driving set comprising diagonal driving electrode 31-33 and large electrode 36) is passive and either floating or grounded.

AC driving circuit 22 comprises a power source 21 coupled to piezoelectric motor 20 through a power transformer 23. An output lead 25 of power transformer 23 is connected to ground. An output lead 27 of power transformer 21 is connected by a switch 44 to one or the other of diagonal driving electrodes 31-33 or 32-34 via driving lines 46 and 48 respectively.

In FIG. 1A, switch 44 is shown, by way of example, connecting output lead 27 to diagonal driving electrode 32-34, which is therefore an active electrode in the configuration of FIG. 1A. Diagonal driving electrode 31-33, which is a passive electrode, is shown as floating. Stray capacitive couplings that affect operation of piezoelectric motor 20 are represented by "'stray" capacitors 50, 52 and 54, shown with dashed lines, that have capacitance $C_{50}$, $C_{52}$ and $C_{54}$ respectively. Capacitance $C_{50}$, $C_{52}$ and $C_{54}$ are strong functions of the lengths of power lines 46 and 48 as well as of the environment of piezoelectric motor 20.

Figure 1B:
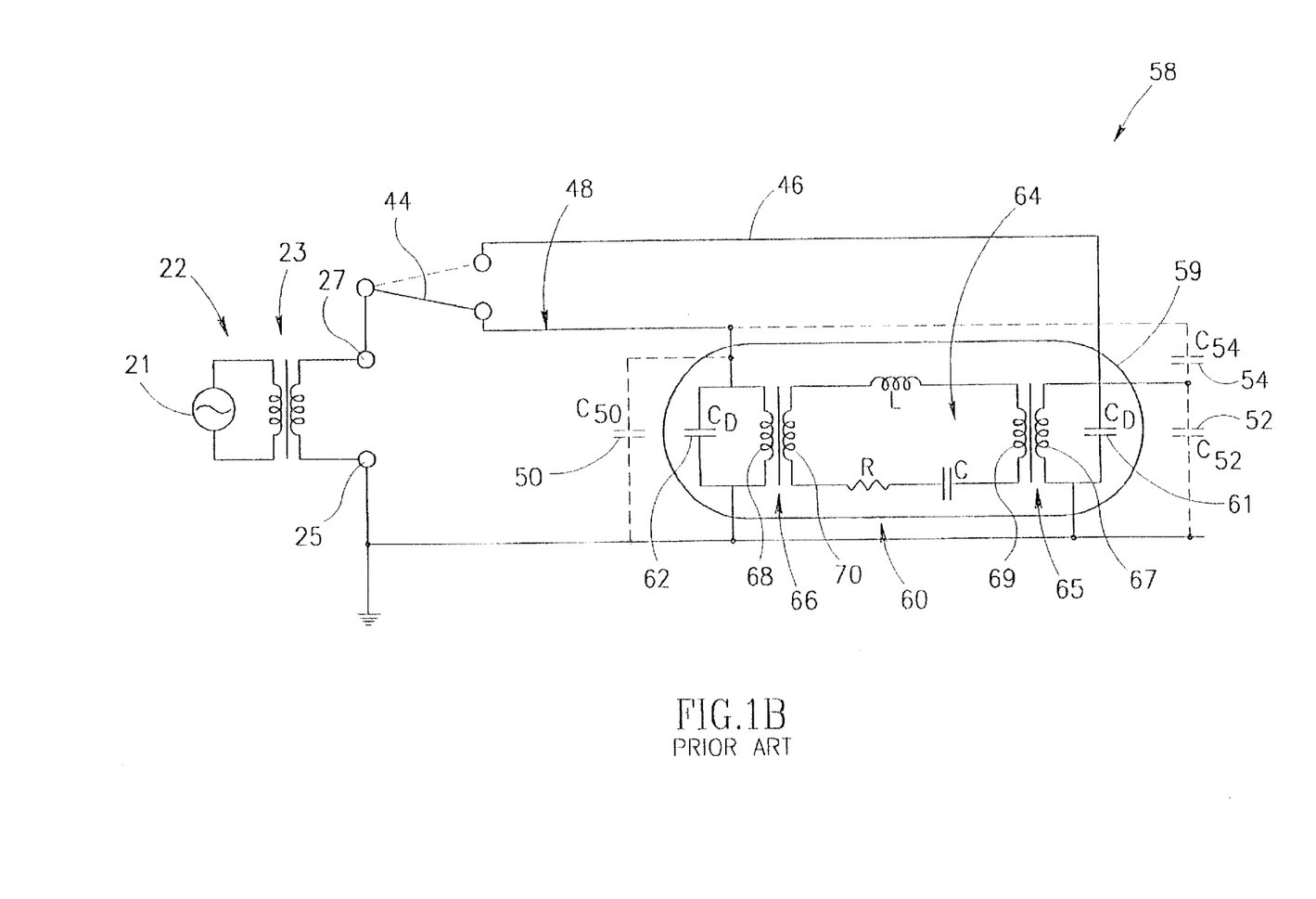
FIG. 1B is a diagram of the piezoelectric motor and the driving circuit, shown in FIG. 1A, in which the piezoelectric motor is replaced by electrical components that characterize its electrical functioning.

FIG. 1B is a diagram of a circuit 58 showing the electrical connections between piezoelectric motor 20 and driving circuit 22, shown in FIG. 1A, in which piezoelectric motor 20 is replaced by a circuit 60, shown inside an elliptical border 59. Circuit 60 represents the electrical functioning of piezoelectric motor 20 for coupling energy into a single vibration mode, e.g. a particular longitudinal or transverse vibration mode of the motor, defined by a particular resonant frequency. Circuit 60 is a standard circuit used in the art to represent coupling energy into a vibration mode of a piezoelectric motor. Circuits that model the electromechanical functioning of piezoelectric motors are discussed, for example in "Fundamentals of Piezoelectricity" by Takuro Ikeda, Oxford University Press 1990 which is incorporated herein by reference.

In circuit 60, capacitance between each of diagonal driving electrodes 31-33 and 32-34 and large electrode 36 is explicitly shown. The set of driving electrodes comprising diagonal driving electrode 31-33 and large electrode 36 is shown as a capacitor 61. The set of driving electrodes comprising diagonal driving electrode 32-34 and large electrode 36 is shown as a capacitor 62. Both capacitors have a same capacitance, "$C_D$", commonly referred to as a "damping capacitance". Capacitors 61 and 62 are coupled to an RLC sub-circuit 64 by transformers 65 and 66 respectively. RLC sub-circuit 64 comprises a resistor "R", capacitor "C" and inductor "L" in series. As is well known in the art, kinetic energy of piezoelectric motor 20 is represented by $LI^2$ and internal energy loss in the piezoelectric motor is represented by $RI^2$, where I represents current in sub-circuit 64. Voltage across capacitor C represents elastic potential energy of piezoelectric motor 20. Transformers 65 and 66 have primary windings 67 and 68 respectively that are connected to capacitors 61 and 62 and secondary windings 69 and 70 respectively that are connected in series with the components of RLC sub-circuit 64. The ratio of secondary to primary windings in each transformer 65 and 66 is "n". The resonant frequency of RLC circuit 64 is substantially the same as the frequency of the desired vibration mode.

In the configuration shown in FIG. 1B the impedance loading driving circuit 22 is the impedance seen at primary winding 68 of transformer 66 in parallel with the impedance of series connected stray capacitors 54 and 52, the impedance of stray capacitor 50 and the impedance of capacitor 62. Let the impedance seen at primary winding 68 be represented by "$Z_0$". Energy is most efficiently coupled from driving circuit 22 to the particular vibration mode of piezoelectric motor 20 that is represented by circuit 60 at a frequency for which $Z_0$ is real. i.e. at the resonant frequency of $Z_0$.

$Z_0$ is equal to $Z_1/n^2$ where $Z_1$ is the impedance across secondary winding 70 of transformer 66. $Z_1$ is determined by R, L and C in series with the impedance seen at secondary winding 69 of transformer 63. This impedance is equal to $n^2$ times the impedance across primary winding 67 of transformer 65, which is substantially equal to $n^2/i\omega(C_D+C_{52})$, where "i" is the imaginary "i" and $\omega$ is a frequency of a voltage across secondary winding 69. In other words, $Z_1$ is determined by R, L and C in series with a capacitor that replaces transformer 65 in sub-circuit 64 and that has a capacitance (ignoring effects of stray capacitor 54) substantially equal to $(C_D+C_{52})/n^2$. The resonant frequency of $Z_1$, and therefore of $Z_0$ is thus a function of $C_{52}$. As a result, a change in $C_{52}$, such as a change caused by a change in lengths of driving lines 46 and/or 48, changes the resonant electrical frequency of piezoelectric motor 20 and shifts the resonant electrical frequency away from a desired vibration frequency of the motor. A shift away from the resonant desired frequency degrades the performance of the piezoelectric motor.

Figure 2A:
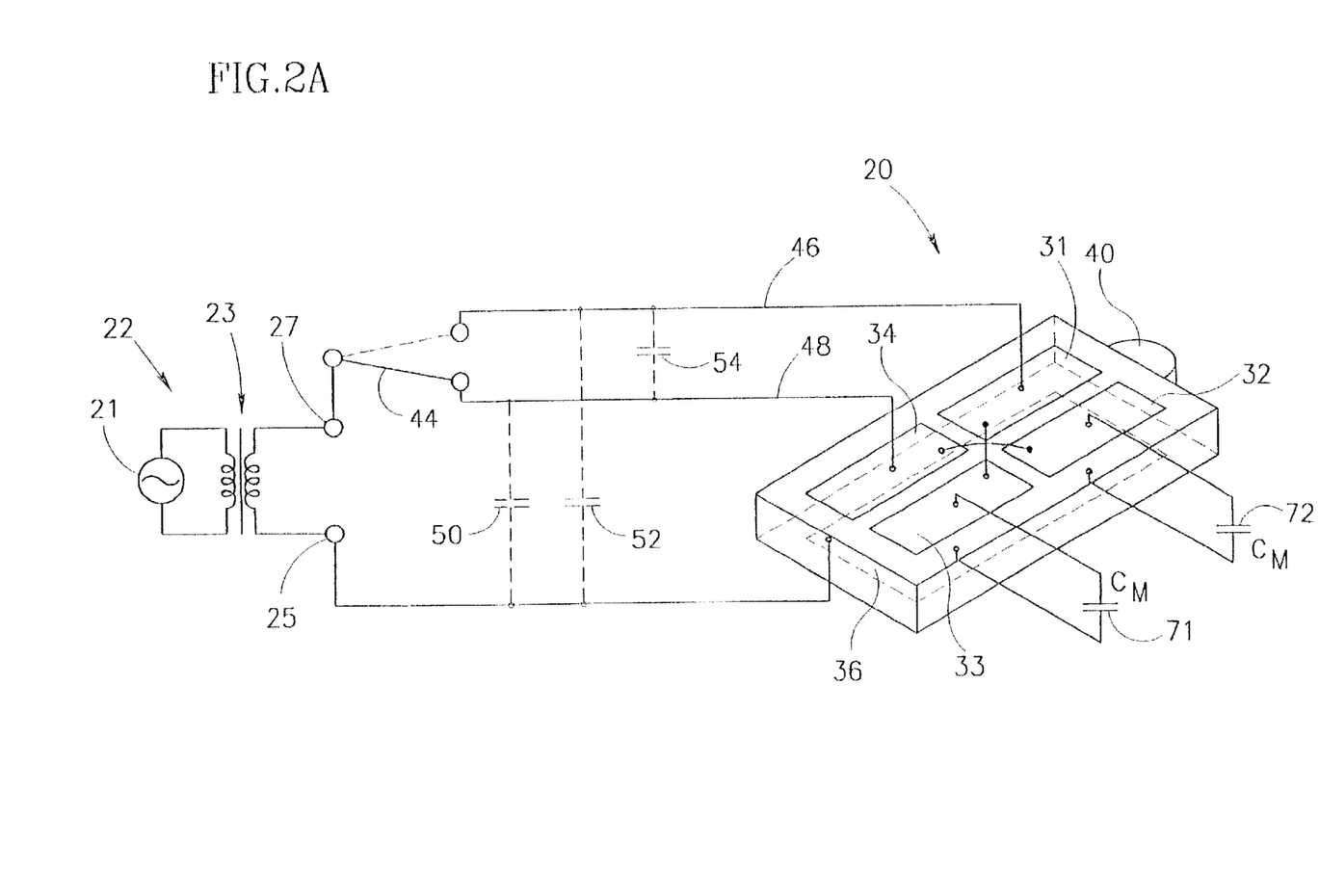
FIG. 2A schematically shows a piezoelectric motor being driven by an AC driving circuit, in accordance with a preferred embodiment of the present invention.

FIG. 2A schematically shows piezoelectric motor 20 being driven by driving circuit 22 in accordance with a preferred embodiment of the present invention. As in FIG. 1A, in FIG. 2A driving circuit 22 is shown, by way of example, connected to diagonal driving electrode 32-34 through switch 44.

In accordance with a preferred embodiment of the present invention diagonal driving electrode 31-32 is coupled to large electrode 36 by a moderating capacitor 71. Similarly, diagonal driving electrode 32-34 is connected to large electrode 36 by a moderating capacitor 72. Each time switch 44 switches driving circuit 22 to one or the other of diagonal driving electrodes 31-32 and 32-34 the driving circuit is also connected to the moderating capacitor that connects the respective diagonal driving electrode to large electrode 36. Preferably, the capacitance of moderating capacitors 71 and 72 are equal. Preferably, the capacitance of moderating capacitors 71 and 72 is substantially larger than the capacitance of stray capacitors coupled to driving electrodes 31-33 and 32-34 and large electrode 36. Let the capacitance of moderating capacitors 71 and 72 be represented by $C_M$.

Figure 2B:
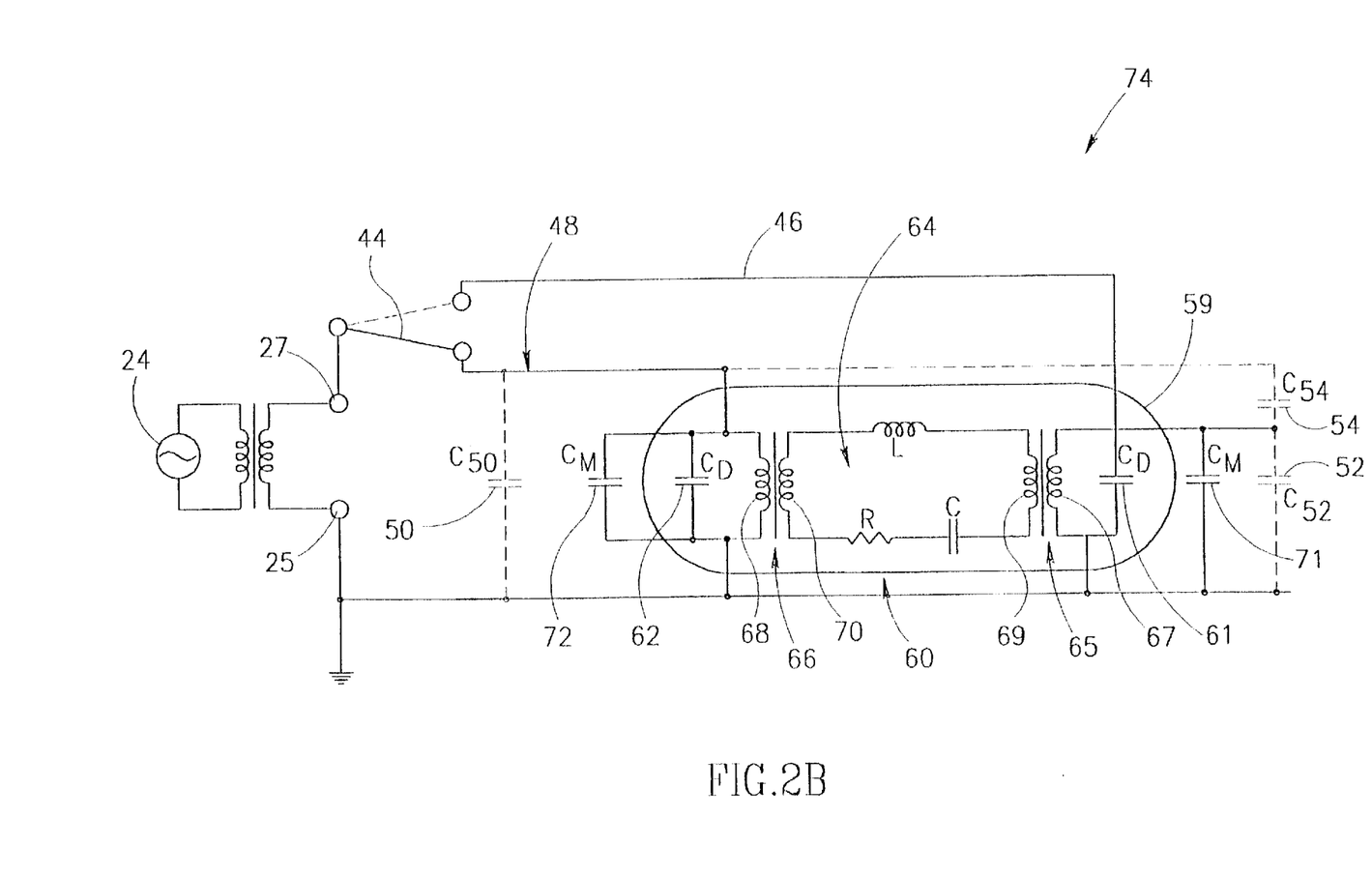
FIG. 2B is a diagram of the piezoelectric motor and the driving circuit shown in FIG. 2A, in which the piezoelectric motor is replaced by electrical components that characterize its electrical functioning.

FIG. 2B shows a diagram of a circuit 74 showing the electrical connections between piezoelectric motor 20 and driving circuit 22, shown in FIG. 2A, in which piezoelectric motor 20 is replaced by circuit 60 comprising sub-circuit 64.

As in FIG. 1B, in FIG. 2B capacitance between diagonal driving electrodes 31-33 and 32-34 and large electrode 36 is represented by capacitors 61 and 62 respectively. Moderating capacitors 71 and 72 are in parallel respectively with capacitors 61 and 62. The effect of moderating capacitors 71 and 72 is therefore to increase the effective capacitance and therefore decrease the impedance between diagonal driving electrodes 31-33 and 32-34 respectively, and large electrode 36.

Circuit 74 is analyzed similarly to prior art circuit 58. The resonant frequency for transmission of energy to piezoelectric motor 20 is the resonant frequency of sub-circuit 64 with transformer 65 replaced by a capacitor having a capacitance $(C_D+C_M+C_{52})/n^2$. The impedance of this capacitor is $n^2/i\omega(C_D+C_M+C_{52})$, which for values of CM substantially larger than $C_{52}$, is relatively independent of changes in $C_{52}$. Typically $C_{52}$, other stray capacitance and $C_D$, have values of about a nanofarad (nf). Preferably, $C_M$ has a value equal to about 5 nf. Typically, n is on the order of 1–10.

The effect of connecting moderating capacitor 71 across the primary winding 67, in accordance with a preferred embodiment of the present invention, is therefore to replace transformer 65 in sub-circuit 67 with a capacitive "replacement" impedance that is substantially independent of capacitance $C_D$ and $C_{52}$. Furthermore, this "replacement" impedance is much smaller than the impedance of capacitor C in sub-circuit 64. Capacitor C typically has a value of about 10 picofarads and for $\omega$=50,000 typical impedance having a magnitude equal to $2 \times 10^6$ ohms. On the other hand, assuming that n is 3, $\omega$=50,000, that $C_D = C_{52}$=1 nf and that $C_M$=5 nf, the replacement impedance has a magnitude of about $2.5 \times 10^4$ ohms. As a result, the resonant frequency of sub-circuit 64 is determined substantially by components R, L and C of sub-circuit 64 and $C_M$. The resonant frequency is relatively stable and substantially independent of changes in $C_{52}$.

In addition, moderating capacitor 71 effectively grounds stray capacitor 54. As a result, stray capacitor 54 is connected across power leads 25 and 27 of driving circuit 22 and is in parallel with the impedance piezoelectric motor 20. While stray capacitor 54 drains current from driving circuit 22 it does not directly affect the resonant frequency and quality of operation of piezoelectric motor 20.

Therefore, as a result of the addition of moderating capacitors 71 and 72, in accordance with a preferred embodiment of the present invention, the performance of piezoelectric motor 20 is relatively immune to changes in stray capacitance. Circuit 74, in accordance with a preferred embodiment of the present invention, provides a more reliable and predictable operation of piezoelectric motor 20 than does prior art circuit 58. Changes in the environment of piezoelectric motor 20 or in the lengths of driving lines that connect the motor to driving circuit 20 do not significantly change or disrupt the performance of the motor.

It should be noted, that whereas moderating capacitors 71 and 72 are shown permanently connected between large electrode 36 and diagonal driving electrodes 31-33 and 32-34 respectively, in some preferred embodiments of the present invention they may be connected to their respective electrodes via switches. Moderating capacitors 71 and 72 are disconnected and connected between their respective electrodes as needed by opening and closing the switches. In some preferred embodiments of the present invention a single moderating capacitor is used. The single moderating capacitor is switched so as to connect large electrode 36 to that diagonal driving electrode of diagonal driving electrodes 31-33 or 32-34 which is passive.

Figure 3A:
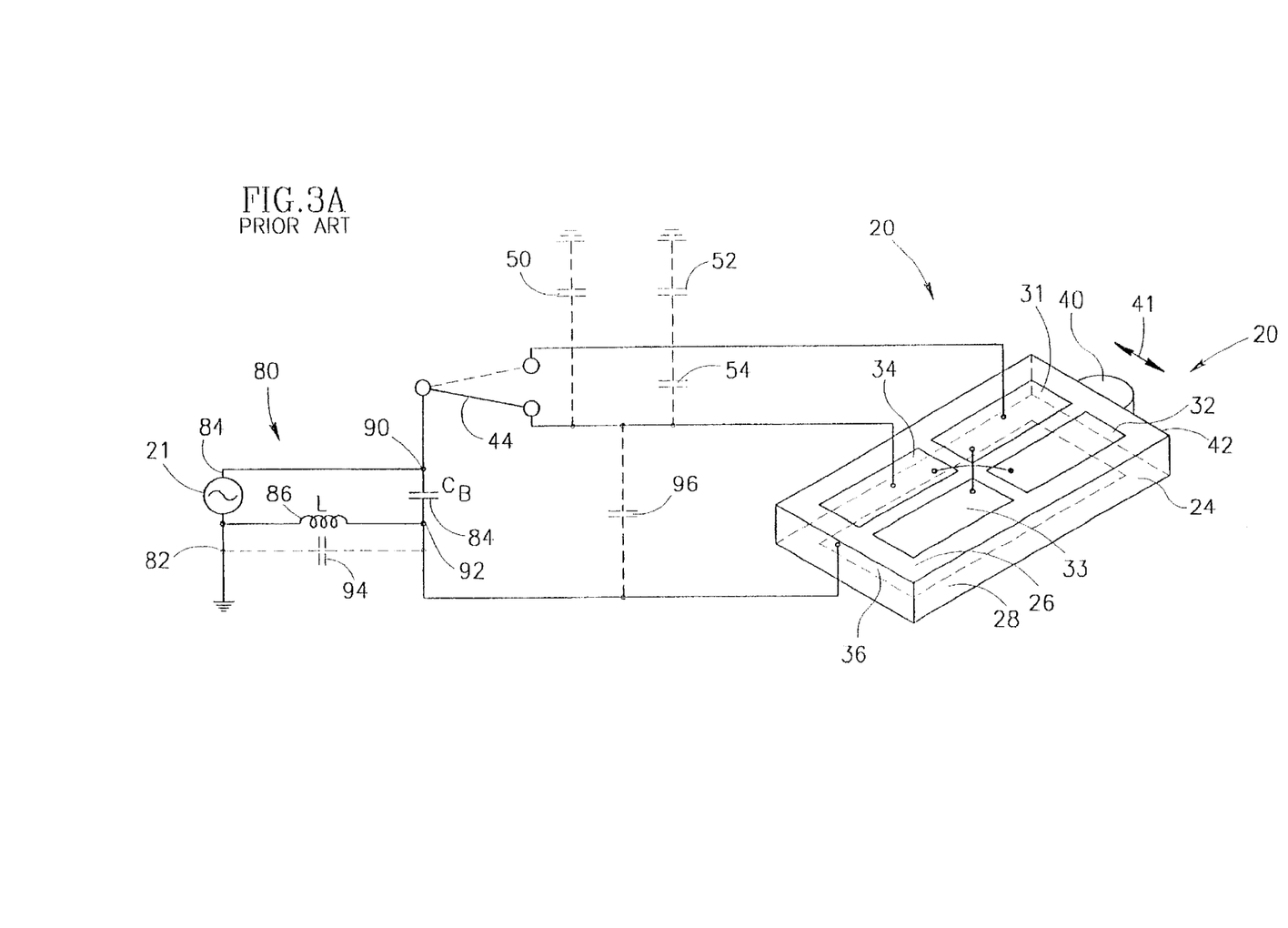
FIG. 3A schematically shows a piezoelectric motor being driven by a resonant driving circuit, in accordance with prior art.

In some configurations, piezoelectric motors are driven with resonant circuits. As in the case of driving a piezoelectric motor using an AC power supply and transformer according to prior art, changes in stray capacitance adversely affect the performance of a piezoelectric motor driven by a resonant circuit in accordance with prior art. FIG. 3 schematically shows piezoelectric motor 20 being driven with a resonant driving circuit 80 according to prior art.

Resonant driving circuit 80 comprises an AC power supply 21 having a grounded lead 82 and a power lead 84, an inductor 86 and a capacitor 88. Inductor 86, connects grounded lead 82 to large electrode 36. Power lead 84 of AC power supply 21 is connected through switch 44 to either diagonal driving electrode 31-33 or diagonal driving electrode 32-34. Capacitor 88 connects nodes 90 and 92 together. The magnitudes of the inductance of inductor 86 and the capacitance of capacitor 88 are determined so that resonant circuit 80 and piezoelectric motor 20 are matched to form a circuit having a resonant frequency near to a desired resonant vibration frequency of piezoelectric motor 20. In FIG. 3A, as in FIGS. 1A–2B, switch 44 is shown by way of example connecting power supply 22 to diagonal driving electrode 32-34. Diagonal driving electrode 31-33 is floating.

The performance of piezoelectric motor 20 driven by resonant driving circuit 80 is affected by the same stray capacitance, represented by capacitors 50, 52 and 54, as is the performance of piezoelectric motor 20 driven by AC driving circuit 22 shown in FIGS. 1A–2B. In addition the performance of piezoelectric motor 20 driven by resonant driving circuit 80 is also affected by stray capacitance represented by capacitors 94 and 96.

Figure 3B:
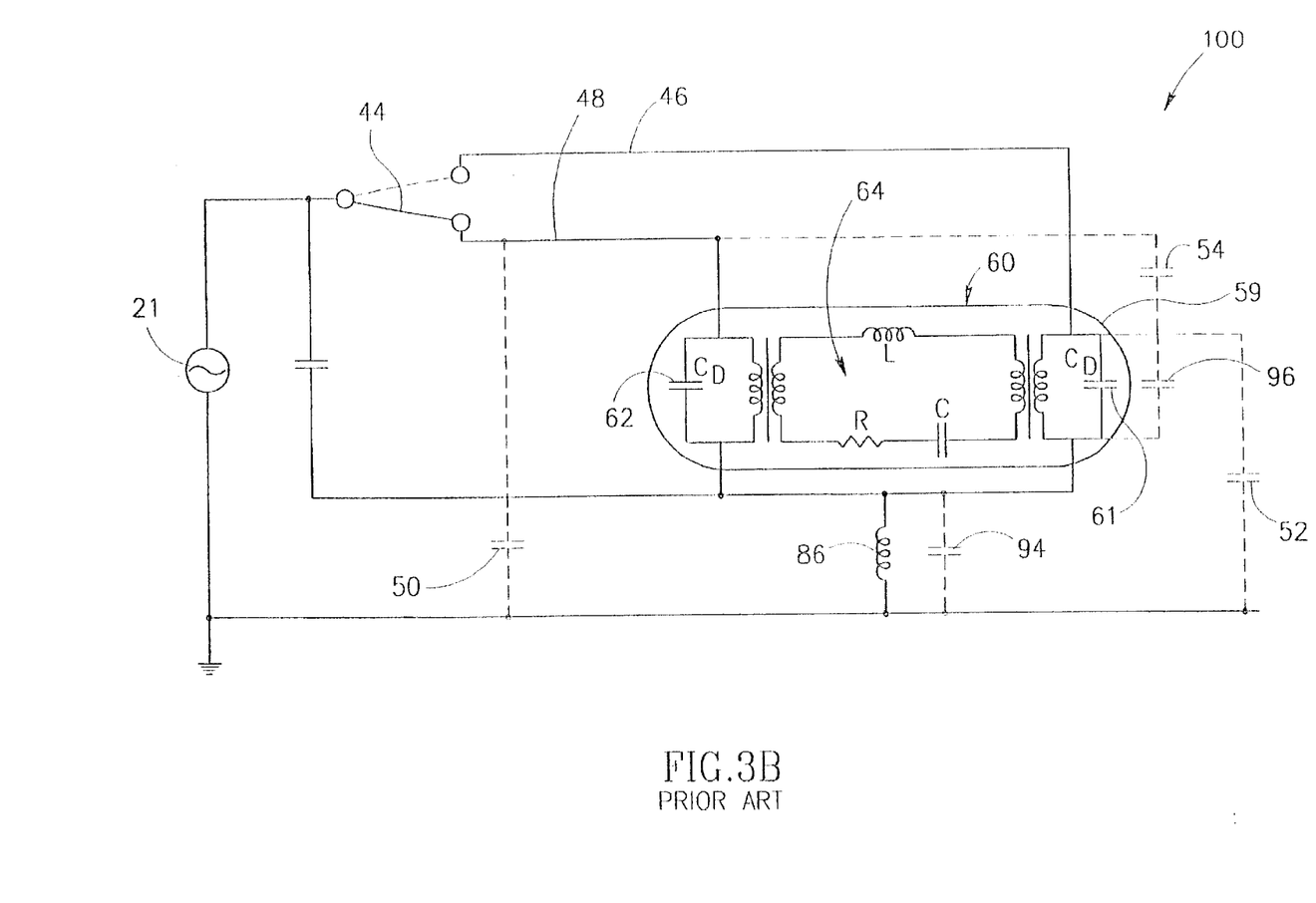
FIG. 3B is a diagram of the piezoelectric motor and the resonant driving circuit shown in FIG. 3A, in which the piezoelectric motor is replaced by electrical components that characterize its electrical functioning.

FIG. 3B shows a diagram of a circuit 100 showing the electrical connections between piezoelectric motor 20 and resonant driving circuit 80, shown in FIG. 3A, in which piezoelectric motor 20 is replaced by circuit 60 comprising sub-circuit 64. From circuit 100 it is seen that the resonant frequency and quality of operation of piezoelectric motor 20 are sensitive to changes in the capacitance of stray capacitors 52, 54, 94 and 96. Stray capacitor 50 is in parallel with the impedance piezoelectric motor 20 and while it drains current from power supply 21 it does not directly affect the resonant frequency and quality of operation of piezoelectric motor 20.

In some preferred embodiments of the present invention, the affects of stray capacitance on the operation of piezoelectric motor 20 are reduced by coupling diagonal driving electrodes 31-32 and 32-34 to large electrode 36 by moderating capacitors. In the same way that moderating capacitors reduce the effects of stray capacitance on the performance of piezoelectric motor 20 when it is driven by driving circuit 22 shown in FIG. 2A, they protect the performance of piezoelectric motor 20 driven by resonant circuit 80.

In some preferred embodiments of the present invention, each diagonal driving electrode 31-32 and 32-34 is connected by a switch, which when the driving electrode is passive, short-circuits the driving electrode to large electrode 36. Short-circuiting the passive electrode to large driving electrode 36 effectively buffers the operation of piezoelectric motor 20 against changes in stray capacitance.

Figure 4A:
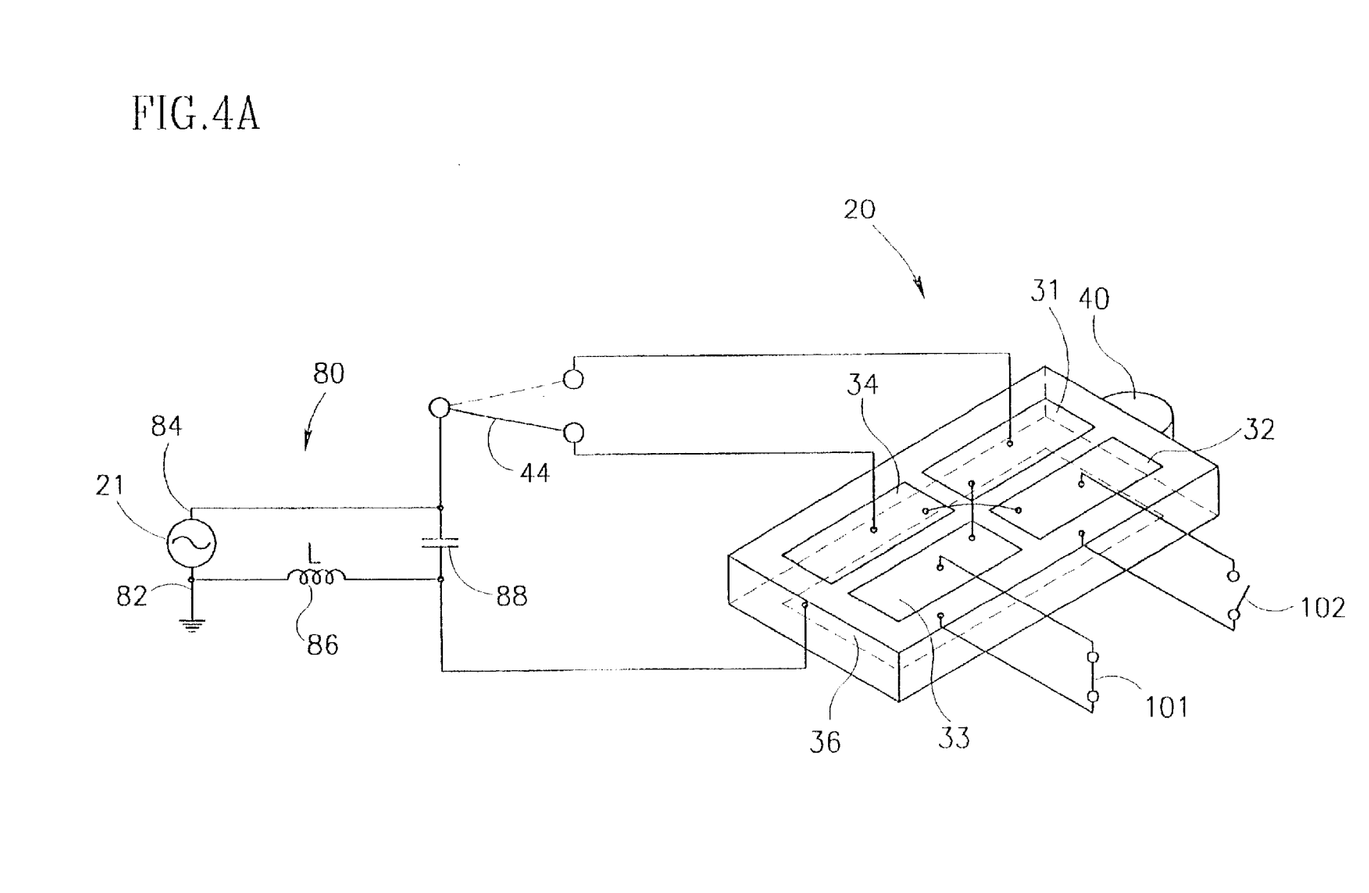
FIG. 4A schematically shows a piezoelectric motor being driven by a resonant driving circuit, in accordance with a preferred embodiment of the present invention.

FIG. 4A schematically shows piezoelectric motor 20 being driven by driving circuit 80 in accordance with a preferred embodiment of the present invention, in which diagonal driving electrodes 31-33 and 32-34 are respectively connected to large electrode 36 by switches 101 and 102. As in FIGS. 1A and 2A driving circuit 22 is shown, by way of example, connected to diagonal driving electrode 32-34 by switch 44. Switch 101 is closed and short-circuits passive diagonal driving electrode 31-32 and large electrode 36. Switch 102 is open and active driving electrode 32-34 and large electrode 36 are connected by capacitor 88 of driving circuit 80.

Figure 4B:
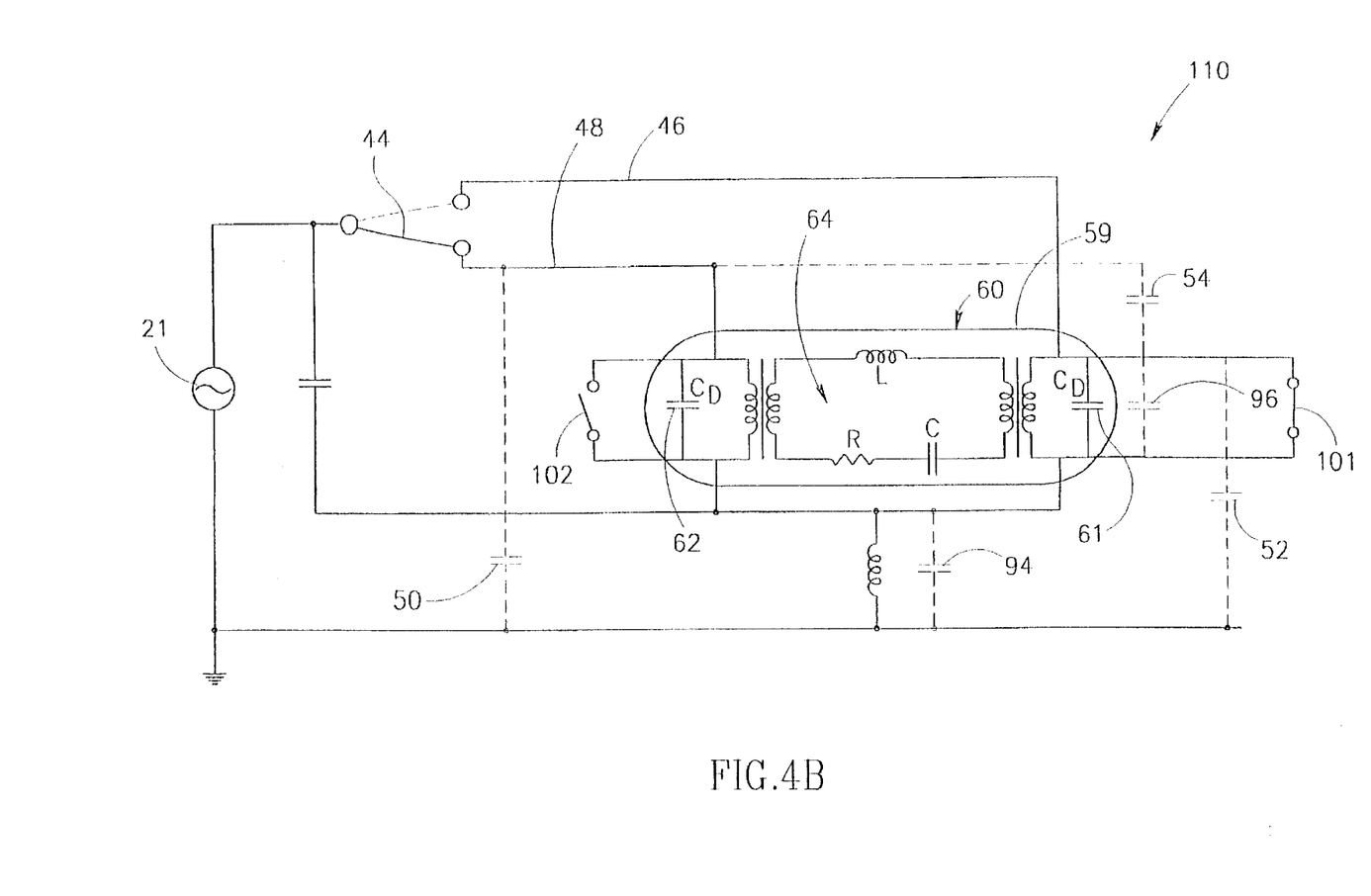
FIG. 4B shows a diagram of a circuit showing the electrical connections between the piezoelectric motor and the resonant driving circuit shown in FIG. 4A, in which the piezoelectric motor is replaced by electrical components that characterize its electrical functioning.

FIG. 4B shows a diagram of a circuit 110, in accordance with a preferred embodiment of the present invention, showing the electrical connections between piezoelectric motor 20 and resonant driving circuit 80, shown in FIG. 4A. In circuit 110 piezoelectric motor 20 is replaced by circuit 60 comprising sub-circuit 64. Diagonal driving electrodes 31-33 and 32-34 are connected by switches 101 and 102 respectively to large electrode 36.

Because passive capacitor 61 is short-circuited by switch 101, there is never a potential difference between diagonal electrode 31-33 and large electrode 36 (as long as switch 101 is closed). In sub-circuit 64 transformer 65 is replaced by a short-circuit and the resonant frequency of sub-circuit 64 is therefore substantially unaffected by stray capacitance. Furthermore, capacitive coupling of diagonal electrode 31-33 to ground does not generate unpredictable voltage differences between diagonal electrode 31-33 and large electrode 36. As a result, passive diagonal electrodes 31-33 cannot excite vibration modes in piezoelectric motor 20 that may unpredictably disrupt desired vibration modes excited by active driving electrodes 32-34 in the piezoelectric motor.

Whereas a switching system for neutralizing stray capacitance that short circuits passive driving electrodes has been described for a piezoelectric motor driven by a resonant driving circuit, such switching systems are not limited to piezoelectric micromotors driven by resonant driving circuits. Similar switching systems are applicable, in accordance with preferred embodiments of the present invention, to piezoelectric motors driven by other types of driving circuits. For example, diagonal electrodes 31-33 and 32-34 in piezoelectric motor 20 driven by driving circuit 22 as shown in FIG. 1A, may be connected to large electrode 36 by "shorting," switches in the same way that they are connected to large electrode 36 in FIG. 4A.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

The present invention has been described using detailed descriptions of preferred embodiments thereof that are provided by way of example and are not intended to limit the scope of the invention. The described preferred embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

What is claimed is:

1. A method for exciting vibrations in a piezoelectric motor having a plurality of electrode sets, each set comprising at least one first electrode and at least one second electrode between which AC voltages are applied to excite vibrations in the piezoelectric motor, the method comprising;

coupling an AC driving circuit to the at least one first electrode and at least one second electrode of a first electrode set;

electrically connecting the at least one first electrode to the at least one second electrode of a second set of electrodes with a non-zero impedance that is substantially less than an impedance between them resulting from stray capacitive coupling; and energizing the driving circuit to apply an AC voltage difference between the at least one first electrode and at least one second electrode of the first set of electrodes to excite the vibrations.

2. A method according to claim 1 wherein electrically connecting the at least one first electrode to the at least one second electrode of the second set of electrodes comprises connecting them with a first capacitor having a capacitance substantially larger than a capacitance between them resulting from stray capacitive coupling.

3. A method according to claim 2 wherein connecting a first capacitor comprises closing a switch, which switch is operable to be open or closed to respectively disconnect the first capacitor from the electrodes and connect the first capacitor to the electrodes.

4. A method according to claim 3 wherein coupling an AC driving circuit to the at least one first electrode and at least one second electrode of the first electrode set comprises opening a switch, which switch is operable to be open or closed to respectively disconnect a second capacitor from between the electrodes and connect the second capacitor between the electrodes.

5. A method according to claim 2 and comprising connecting the at least one first electrode to the at least one second electrode of the first electrode set with a second capacitor having a capacitance substantially larger than a capacitance between them resulting from stray capacitive coupling.

6. A method according to claim 5 wherein the first and second capacitors are connected permanently between their respective at least one first and at least one second electrodes.

7. A method according to any one of claims 4–6 wherein the first and second capacitors have substantially the same capacitance.

8. A method for exciting vibrations in a piezoelectric motor having a plurality of electrode sets, each set comprising at least one first electrode and at least one second electrode between which AC voltages are applied to excite vibrations in the piezoelectric motor, the method comprising;

coupling a resonant AC driving circuit to the at least one first electrode and at least one second electrode of a first electrode set short-circuiting the at least one first electrode to the at least one second electrode of a second electrode set; and energizing the resonant AC driving circuit to apply an AC voltage difference between the at least one first electrode and at least one second electrode of the first set of electrodes to excite the vibrations.

9. A method according to claim 8 wherein short-circuiting the electrodes comprises closing a switch operable to be open and closed to respectively disconnect from between the electrodes and connect between the electrodes a substantially zero impedance.

10. A method according to claim 9 wherein coupling a resonant AC driving circuit to the at least one first electrode and at least one second electrode of the first electrode set comprises opening a switch, which switch is operable to be open and closed to respectively disconnect from between the electrodes and connect between them a substantially zero impedance.

11. A piezoelectric motor comprising:

a plurality of sets of electrodes, each set comprising at least one first electrode and at least one second electrode between which AC voltages are applied to excite vibration modes in the piezoelectric motor; and a capacitor for each set of electrodes that connects the at least one first electrode to the at least one second electrode of the set of electrodes wherein the capacitor has a capacitance substantially larger than a stray capacitance between the at least one first and at least one second electrode.

12. A piezoelectric motor according to claim 11 wherein the capacitor for each set of electrodes is permanently connected between the at least one first electrode and at least one second electrode of the set of electrodes.

13. A piezoelectric motor according to claim 11 and comprising a switch for each set of electrodes operable to be open and closed to respectively disconnect the capacitor from between the electrodes and connect the capacitor between the electrodes.

14. A piezoelectric motor according to claim 11 wherein all the capacitors have substantially a same capacitance.

15. A piezoelectric motor comprising:

a plurality of sets of electrodes, each set comprising at least one first electrode and at least one second electrode between which AC voltages are applied to excite vibration modes in the piezoelectric motor; and a switch between the first and second at least one electrode, which switch is operable to be open and closed to respectively disconnect from between the electrodes and connect between the electrodes a substantially zero impedance.

16. A piezoelectric motor according to claim 12 wherein all the capacitors have substantially a same capacitance.

17. A piezoelectric motor according to claim 14 wherein all the capacitors have substantially a same capacitance.

* * * * *

UNITED STATES PATENT AND TRADEMARK OFFICE
CERTIFICATE OF CORRECTION

PATENT NO.    : 6,661,153 B1
DATED         : December 9, 2003
INVENTOR(S)   : Lior Shiv et al.

It is certified that error appears in the above-identified patent and that said Letters Patent is hereby corrected as shown below:

Title page,
Item [30], Foreign Application Priority Data, change "00519" to
-- PCT/IL98/00519 --

Signed and Sealed this

Twenty-fourth Day of August, 2004

JON W. DUDAS
*Director of the United States Patent and Trademark Office*